United States Patent [19]

Huang

[11] Patent Number: 5,537,420
[45] Date of Patent: Jul. 16, 1996

[54] CONVOLUTIONAL INTERLEAVER WITH REDUCED MEMORY REQUIREMENTS AND ADDRESS GENERATOR THEREFOR

[75] Inventor: Zheng Huang, Willow Grove, Pa.

[73] Assignee: General Instrument Corporation of Delaware, Chicago, Ill.

[21] Appl. No.: 238,259

[22] Filed: May 4, 1994

[51] Int. Cl.[6] .................................................. G06F 11/00
[52] U.S. Cl. ............................. 371/2.1; 371/2.2; 371/43
[58] Field of Search ........................ 371/2.1, 2.2, 39.1, 371/38.1, 37.1, 10.1, 21.1, 40.1, 43, 44, 45; 395/575; 360/48, 40, 71, 72.1, 72.2, 133, 135; 369/272, 275.3

[56] References Cited

U.S. PATENT DOCUMENTS

| | | | |
|---|---|---|---|
| 4,084,226 | 4/1978 | Anderson et al. | 364/200 |
| 5,042,033 | 8/1991 | Costa . | |
| 5,172,379 | 12/1992 | Burrer et al. | 371/37.1 |

Primary Examiner—Robert W. Beausoliel, Jr.
Assistant Examiner—Phung My Chung
Attorney, Agent, or Firm—Barry R. Lipsitz; Ralph F. Hoppin

[57] ABSTRACT

A convolutional interleaver and addressing scheme where up to B consecutive symbols containing errors can be interleaved such that they are separated from each other by at least N intervening symbols. Memory, such as RAM, is configured with (B-1) cells of increasing size for storing symbols from a data stream. A first one of the cells has M storage locations which store M symbols. Each successive one of the cells has M more storage locations than the immediately preceding cell for storing M more symbols than the immediately preceding cell, where M=N/B. The cells are successively addressed to write a next symbol from the stream into a next write symbol location in a currently addressed cell and to read a symbol from the location of the currently addressed cell immediately following the next write symbol location. The locations are accessed in a first revolving manner such that the last location in a cell is followed by the first location in that cell. The cells are addressed in a second revolving manner such that the (B-1)th cell is followed by the first cell, or vice versa. An intervening transfer stage between the (B-1)the cell and the first cell to directly transfers the next symbol to the interleaver output. Each consecutive symbol from the stream is written into a next consecutive one of the cells. A deinterleaver has the same structure.

16 Claims, 4 Drawing Sheets

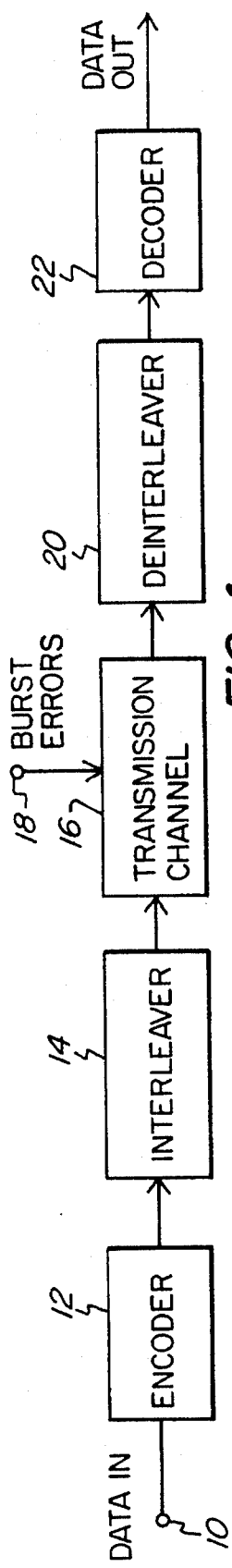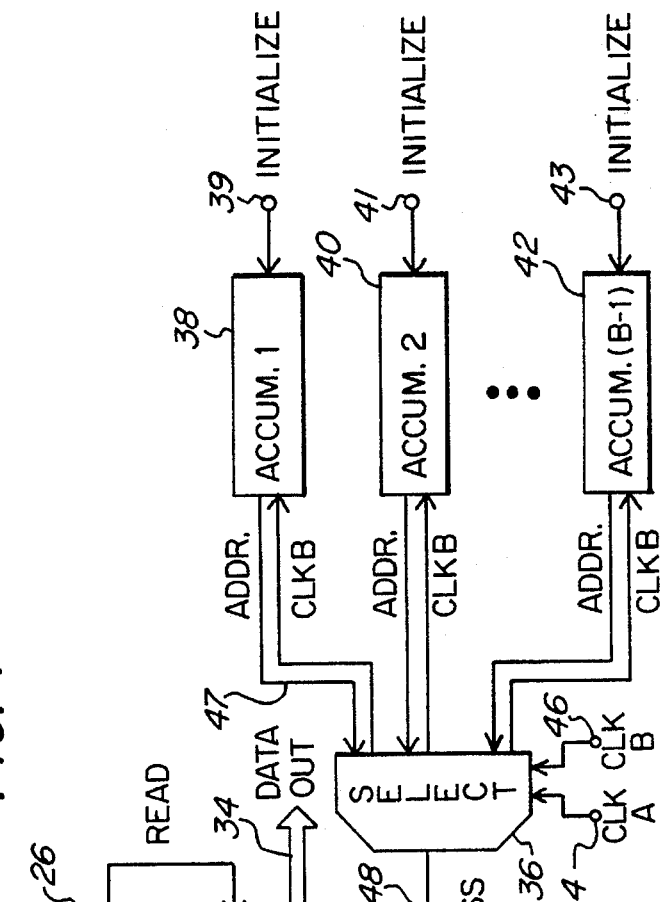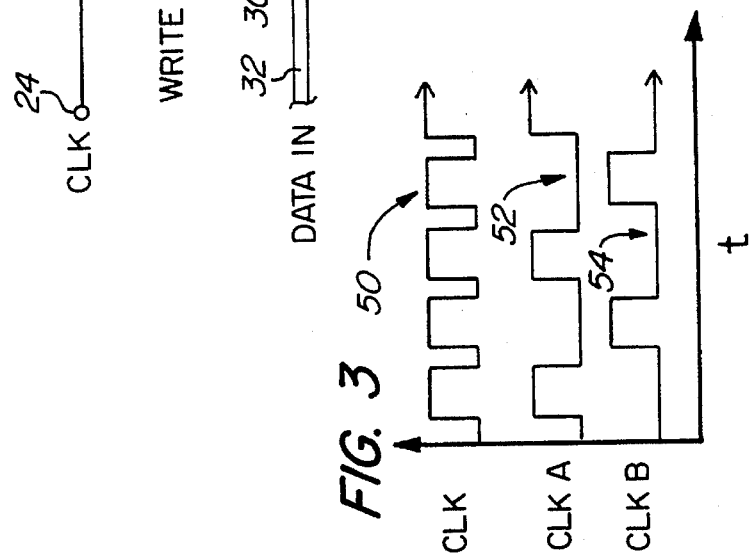

5,537,420

CONVOLUTIONAL INTERLEAVER WITH REDUCED MEMORY REQUIREMENTS AND ADDRESS GENERATOR THEREFOR

BACKGROUND OF THE INVENTION

The present invention relates to digital communication, and more particularly to an interleaver for reducing the effects of burst errors in a digital communication system.

The communication of digital signals will invariably result in transmission errors, even in systems designed to reduce the frequency of occurrence of such errors. The errors are caused by many well known factors, including noise and other imperfections in the transmission channel.

In order to cope with transmission errors, error correcting codes such as block codes have been developed. A block code is a mapping of K input binary symbols into L output binary symbols. Since L is greater than K, the code can be Selected to provide redundancy, such as parity bits, which are used by a decoder to provide some error detection and error correction ability. The design and implementation of error correcting codes is well known in the art, and a discussion of the subject can be found in G. C. Clark and J. B. Cain, "Error-Correction Coding for Digital Communications," Plenum Press, New York, 1981.

Any error correcting code is limited by the number of consecutive errors that it can detect and/or correct. Thus, "burst errors" comprising a relatively large number of consecutive errors are particularly troublesome for a digital communication system. A solution to the burst error problem is to interleave the data to be communicated prior to transmission such that a burst error affecting a succession of interleaved data symbols will be spread apart when the symbols are deinterleaved at a receiver. Thus, by interleaving an encoder output sequence prior to transmission and deinterleaving the sequence prior to decoding, burst errors are distributed more uniformly at the decoder input.

An interleaver is a device that rearranges (or permutes) the ordering of a sequence of symbols in a deterministic manner. The corresponding deinterleaver at the receiver applies the inverse permutation to restore the sequence of transmitted symbols to its original order. Such interleavers are typically placed externally with respect to the coder/decoder circuits used for error detection and correction. However, certain decoder structures are known in which interleaving can be applied internally in a very simple fashion. An example is a Meggitt-type decoder structure.

One class of interleavers is known as periodic interleavers, for which the interleaving permutation is a periodic function of time. Examples are block interleavers, which accept symbols in blocks and perform identical permutations over each block of symbols, and convolutional interleavers which have no fixed block structure, but perform a periodic permutation over a semi-infinite sequence of coded symbols. A block interleaver typically takes the coded symbols and writes them by columns into a matrix with N rows and B columns. The permutation consists of reading these symbols out of the matrix by rows prior to transmission. Such an interleaver is referred to as a (B, N) block interleaver. The deinterleaver performs the inverse operation. Symbols are written into the deinterleaver by rows and read out by columns. Such interleavers are easily implemented with well known digital technology.

In convolutional interleavers, coded symbols are shifted sequentially into a bank of B registers with increasing lengths. With each new code symbol, a commutator switches to a new register and the new code symbol is shifted in while the oldest code symbol in that register is shifted out to the transmission channel. The input and output commutators operate synchronously. The deinterleaver has a similar structure and performs the inverse operation. It will be appreciated that for proper deinterleaving the deinterleaver commutator must be synchronized with the interleaver commutator. The implementation of such an interleaver can be done with a random access memory, rather than with shift registers, simply by implementing the appropriate control of memory access.

The most important characteristics of a convolutional interleaver are:

1. the minimum separation at the interleaver output is B symbols for any two symbols that are separated by less than N symbols at the interleaver input;

2. any burst of $b<B$ errors inserted by the channel will result in single errors at the deinterleaver output separated by at least N symbols;

3. a periodic pattern of single errors spaced by $N+1$ symbols results in a burst length of B at the deinterleaver output; and 4. the total end-to-end delay is $N(B-1)$ symbols and the memory requirement is $N(B-1)/2$ in both the interleaver and deinterleaver. This is half the required delay and memory in a block interleaver/deinterleaver. The parameter B is chosen to be larger than the maximum expected length of the burst errors. N is chosen to be larger than the decoding constraint length for convolutional codes.

Even though convolutional interleavers and deinterleavers require only half the memory of block interleavers, a substantial amount of memory is still required in order to implement these devices for practical communication systems. It would therefore be advantageous to provide an interleaver/deinterleaver implementation in which the memory requirements are further reduced. It would be further advantageous to provide an efficient address generator for a convolutional interleaver implemented in random access memory (RAM), which enables a reduction in the amount of RAM required to implement the interleaver/deinterleaver structure.

The present invention provides an interleaver and deinterleaver structure having the aforementioned advantages.

SUMMARY OF THE INVENTION

In accordance with the present invention, a convolutional interleaver is provided for interleaving a stream of symbols to separate up to B consecutive symbols containing errors such that the error containing symbols are separated from each other by at least N intervening symbols. Memory means are configured to provide $(B-1)$ cells of increasing size for storing symbols from the stream. A first One of the cells has M storage locations adapted to store M symbols. Each successive one of the cells has M more storage locations than an immediately preceding cell for storing M more symbols than the immediately preceding cell, where $M=N/B$. Means are provided for successively addressing the cells to write a next symbol from the stream into a next write symbol location in a currently addressed cell and to read a symbol from the location of the currently addressed cell immediately following the next write symbol location. The locations within each cell are accessed in a first revolving manner such that the last location in the cell is followed by the first location in that cell. The cells are addressed in a second revolving manner such that the $(B-1)$th cell is followed by the first cell, or vice versa. An intervening transfer stage can be provided between the (B−1)th cell and the first cell to directly transfer the next symbol to the interleaver output. The transfer stage can comprise a zero cell in the memory means or a latch for inputting the next symbol during a write cycle and immediately outputting that symbol during the next read cycle. Each consecutive symbol from the stream is written into a next consecutive one of the cells or, after the (B−1)th cell, passed through the transfer stage.

The addressing means can comprise (B−1) accumulators, each associated with a different one of the (B−1) cells. Means are provided for initializing each of the accumulators with a starting location in the cell associated therewith. The accumulators are incremented to address a next location in the cell associated therewith after a symbol is written into that cell. The incrementing means are adapted to access the storage locations in the cell in the first revolving manner. Means are provided for sequentially coupling the accumulators to an address port of the memory means to address the cells in the second revolving manner.

The memory means can comprise a random access memory having a write control and a read control in addition to the address port. In such an embodiment, the interleaver further comprises control means for actuating the write control when an accumulator is first coupled to the address port to enable the next symbol in the data stream to be written into the cell and cell location pointed to by the accumulator. The control means actuate the read control when the accumulator has been incremented to the next cell location to enable a symbol to be read from the next cell location.

The present invention also provides an address generator for a (B, N) convolutional interleaver or deinterleaver, where B is a maximum number of consecutive symbols containing burst errors that can be separated by the interleaver and N is a minimum separation inserted between errors by the interleaver. The address generator comprises (B−1) accumulators, each associated with a different one of (B−1) interleaver or deinterleaver cells of progressively increasing length. Means are provided for initializing each of the accumulators with a starting address specifying a first storage location in the cell associated with the accumulator. Each accumulator is incremented to a next cell location address after a symbol is written into the cell associated with the accumulator. The next cell location addresses are provided in a first revolving manner such that the first location in a cell is addressed after the last location in that cell. Means are provided for coupling the accumulators to address the cells in a second revolving manner such that the (B−1)th cell is followed by the first cell, or vice versa. An intervening transfer stage can be provided between the (B−1)th cell and the first cell to directly transfer the next symbol to the interleaver (or deinterleaver) output. Each consecutive symbol from the stream is written into a next consecutive one of the cells or, after the (B−1)th cell, passed through the transfer stage.

Control means are provided for the address generator for actuating a write control input of the interleaver or deinterleaver cells when an accumulator is first coupled to address a cell to enable the next symbol in the data stream to be written into the cell and cell location pointed to by the accumulator. The control means also actuate a read control input of the interleaver or deinterleaver cells when the accumulator has been incremented to the next cell location to enable a symbol to be read from the next cell location.

The present invention further provides a convolutional deinterleaver for reconstructing sets of B consecutive symbols that are separated from each other in an interleaved data stream by at least N intervening symbols. Memory means are configured to provide (B−1) cells of increasing size for storing symbols from the interleaved data stream. A first one of the cells has M storage locations adapted to store M symbols. Each successive one of the cells has M more storage locations than an immediately preceding cell for storing M more symbols than the immediately preceding cell, where M=N/B. Means are provided for successively addressing the cells to write a next symbol from the interleaved data stream into a next write symbol location in a currently addressed cell and to read a symbol from the location of the currently addressed cell immediately following the next write symbol location. The locations are accessed in a first revolving manner such that the last location in a cell is followed by the first location in that cell. The cells are addressed in a second revolving manner such that the (B−1)th cell is followed by the first cell, or vice versa. An intervening transfer stage can be provided between the (B−1)th cell and the first cell to directly transfer the next symbol to the deinterleaver output. Each consecutive symbol from the interleaved data stream is written into a next consecutive one of the cells or, after the (B−1)th cell, passed through the transfer stage. The addressing means for the deinterleaver can be essentially identical to that described above for the interleaver.

BRIEF DESCRIPTION OF THE DRAWINGS

FIG. 1 is a block diagram of a communication path utilizing external interleaving and deinterleaving;

FIG. 2 is a block diagram of an interleaver in accordance with the present invention;

FIG. 3 is a timing diagram showing the clocks used in the implementation of FIG. 2;

DETAILED DESCRIPTION OF THE PREFERRED EMBODIMENT

Figure 4:
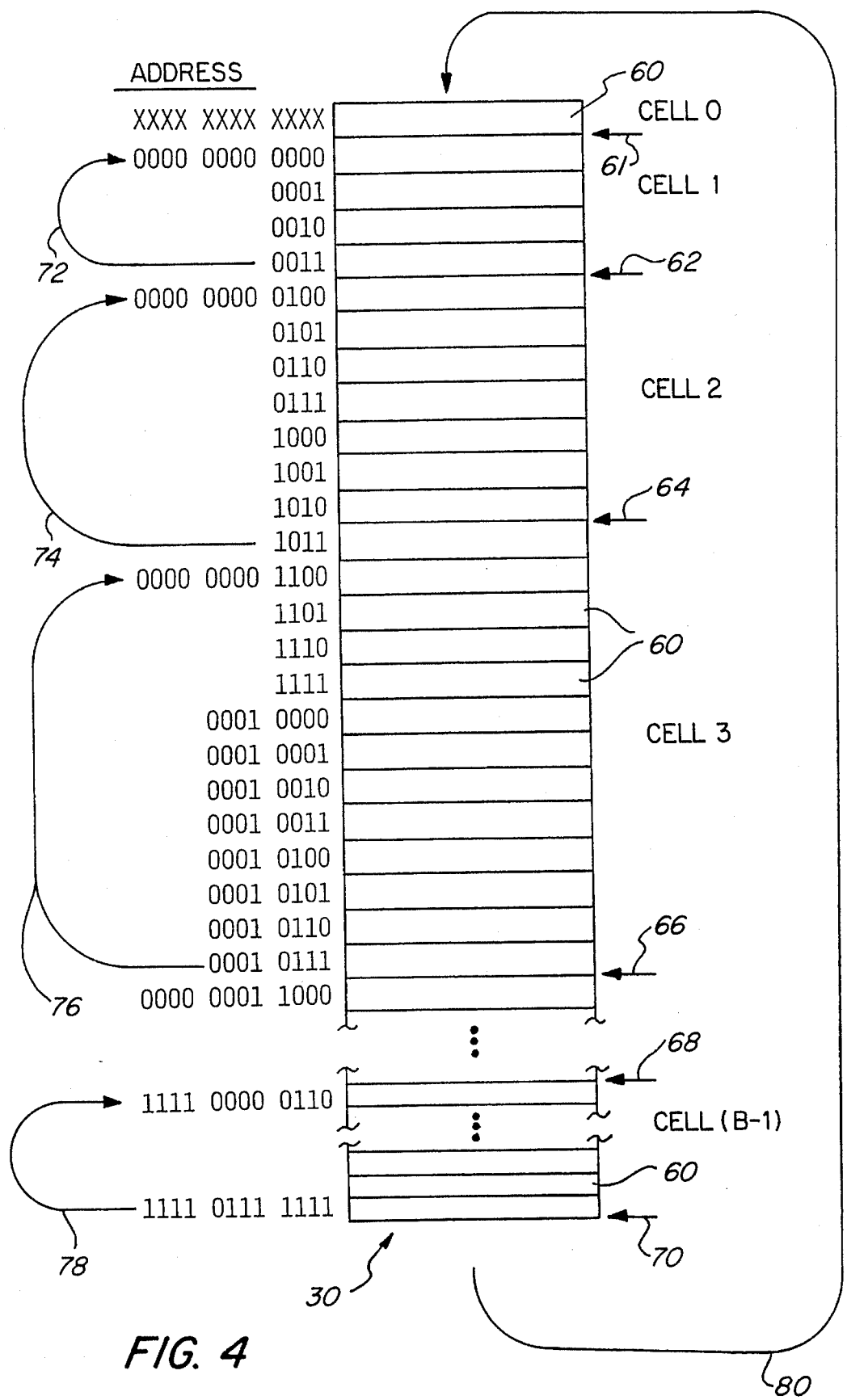
FIG. 4 is a diagrammatic illustration showing a sample partitioning of an interleaver RAM in accordance with the present invention.

The present invention provides a convolutional interleaver and deinterleaver structure for use in interleaving a stream of symbols to separate up to B consecutive symbols containing errors such that the error containing symbols are separated from each other by at least N intervening symbols. The invention is implemented in RAM, although various other types of memory can be substituted as will be appreciated by those skilled in the art. A novel address generator is provided for accessing individual memory cells into which successive symbols are written and subsequently read.

FIG. 1 illustrates the general concept of an interleaver and deinterleaver in a communication system. Data to be transmitted, in the form of consecutive "symbols" is input to an encoder 12 via a terminal 10. The encoder encodes the symbols (e.g., for purposes of error detection and correction) in a conventional manner. The encoded symbols are then input to an external interleaver 14 which rearranges the ordering of the symbols in a deterministic manner. The encoded, interleaved symbols are then communicated via a transmission channel 16. It is to be expected that the stream of symbols will be subject to various noise and distortion in the transmission channel, which can result in errors in the symbol data.

Random, intermittent errors in the data stream are usually easily corrected using well known error detection and correction schemes, which may be provided by schemes as simple as adding parity bits to the transmitted data, or by more sophisticated coding schemes such as convolutional coding, which can be provided in a concatenated arrangement using, e.g., an inner trellis code and an outer Reed-Solomon code. It is more difficult to recover from bursts of errors that affect a plurality of adjacent symbols. The introduction of such burst errors into the transmission channel is shown diagrammatically via terminal 18.

Deinterleaver 20 is located at the receiver, and performs the inverse of the permutation applied by the interleaver, to restore the sequence of symbols to its original ordering. Thus, the data stream output from deinterleaver 20 to decoder 22 carries the symbols in the same order in which they were originally input at terminal 10. By interleaving and deinterleaving the symbols in this manner, burst errors introduced by the transmission channel are separated so that the likelihood of adjacent symbols containing errors is reduced. This enables error correction algorithms to provide better performance. Decoder 22 decodes the symbols encoded by encoder 12, and outputs the data in substantially the same form in which it was originally input.

Figure 6:
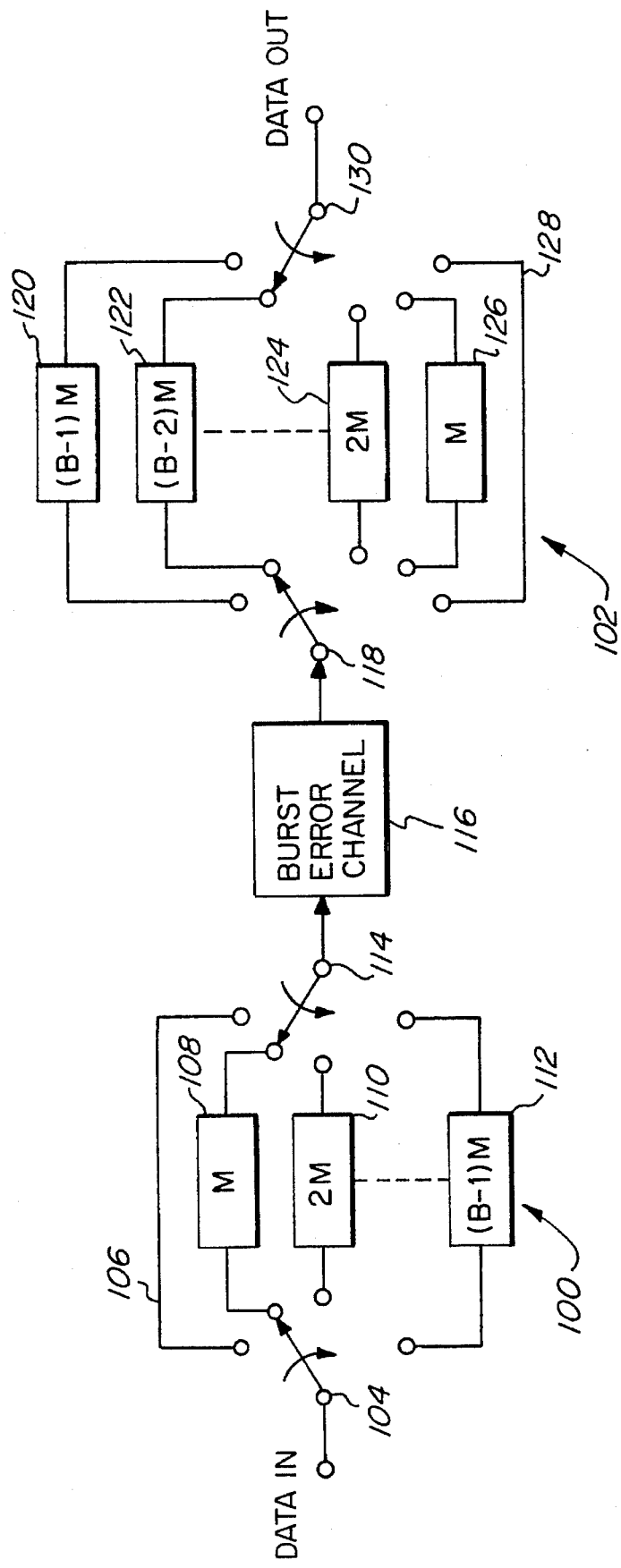
FIG. 6 is a diagrammatic illustration of a conventional prior art convolutional interleaver/deinterleaver provided for purposes of explanation.

FIG. 6 illustrates a prior art shift register implementation of a convolutional interleaver/deinterleaver. Data is input to interleaver 100 via a commutator 104. The interleaver comprises a transfer stage 106 followed by a bank of (B−1) registers 108, 110, . . . 112 of increasing length. With each new code symbol, the commutator 104 switches to a new register and the new code symbol is shifted in while the oldest code symbol in that register is shifted out to the channel. When the commutator is connected to transfer stage 106, the input code symbol is directly transferred to the output of the interleaver. An output commutator 114 switches synchronously with the input commutator 104.

After data is transmitted over a channel 116, which introduces burst errors, it is input to deinterleaver 102 via commutator 118. The deinterleaver performs the inverse operation of interleaver 100. A bank of (B−1) registers and a transfer stage 128 are sequentially accessed for the input and output of data. Data is output from the deinterleaver 102 via commutator 130. It is noted that for proper deinterleaving, the deinterleaver commutators must be synchronized with the interleaver commutators. Actual implementation of such an interleaver and deinterleaver can be accomplished with a random access memory, instead of with shift registers, simply by implementing the appropriate control of memory access.

FIG. 2 illustrates, in block diagram form, an interleaver or deinterleaver structure in accordance with the present invention that requires less memory than prior art devices. The embodiment illustrated in FIG. 2 is a random access memory (RAM) implementation. Those skilled in the art will appreciate that other memory structures can be substituted for the RAM structure illustrated, without departing from the inventive concept of the present invention. In the FIG. 2 embodiment, data to be interleaved is input to RAM 30 via data path 32. Data is written to RAM 30 and read therefrom in a specific order in response to address signals input via address path 48. A control circuit 26 is responsive to a clock signal input via terminal 24 to actuate the RAM to either write a symbol into a currently addressed cell or to read a symbol from the currently addressed cell. The symbols read from the RAM are output via a data output path 34.

Addressing of the RAM is provided by a series of accumulators 38, 40, . . . 42 which are successively accessed, one at a time, by a selector 36. An interleaver can be constructed to separate any desired maximum number B of consecutive symbols by a minimum separation N. For example, if it is anticipated that the maximum number of consecutive symbols containing burst errors in a communication system will be thirty-two, and the error correction scheme used is capable of correcting errors in one out of 128 symbols, an interleaver can be provided where B=32 and N=128.

In providing such an interleaver in accordance with the present invention, (B−1) accumulators (38, 40, . . . 42) are provided, each associated with a different one of (B−1) interleaver cells of progressively increasing length in RAM 30. The accumulators are initialized via terminals 39, 41, . . . 43, respectively, with a starting address specifying a first storage location in the cell of RAM 30 associated with the accumulator. A clock signal (CLK B) input to terminal 46 of selector 36 is coupled to each accumulator when the accumulator is selected by the selector, in order to increment the accumulator to a next cell location address within RAM 30 after a symbol is written into the cell associated with the accumulator when the accumulator is first selected. Thus, for example, when selector 36 first selects accumulator 38 in response to a clock pulse (CLK A) input to terminal 44 of the selector, the address to which the accumulator is set will be output via lines 47 and 48 to RAM 30, at the same time that control 26 instructs the RAM to write the next symbol input via data path 32 into the RAM. The symbol is written into the proper location established by the address output from accumulator 38, and then CLK B arrives to cause accumulator 38 to increment to the next address. This address is also coupled to the address port of RAM 30 via lines 47 and 48, at the same time that a next clock pulse input to terminal 24 causes control 26 to actuate RAM 30 to output the symbol stored in the newly addressed RAM location via data output path 34.

Each of the clocks is illustrated in FIG. 3. The system clock 50 comprises a series of pulses that are input to control circuit 26 via terminal 24. Clock 52 (CLK A) comprises one-half the pulses of the system clock 50, and is input to terminal 44 of the selector to select the next successive accumulator after the previous accumulator has provided both a write address and a read address to RAM 30. Clock 54 (CLK B) is the complement of clock 52, and increments the currently selected accumulator to provide the next address as a read address after the address present at the accumulator output when the accumulator is first selected has been used to address RAM 30 to write a symbol therein.

The cell location addresses provided by each accumulator are output in a first revolving manner such that the first location in a RAM cell is addressed after the last location in that cell. The accumulators are coupled to address the cells in a second revolving manner, such that the (B−1)th cell is followed by a transfer stage equivalent, e.g., to transfer stage 106 of FIG. 6, which is then followed by the first RAM cell. It should be appreciated that the transfer stage can be implemented in the RAM, in which case it comprises a RAM cell referred to herein as the "zero cell." In this manner, each consecutive symbol from the data stream input via data path 32 is written into a next consecutive one of the RAM cells. It is noted that the second revolving order can be reversed, such that the first cell (or transfer stage) is followed by the (B−1)th cell. For example, a deinterleaver may revolve in the reverse order as the interleaver.

The address sequence used to write successive symbols into the RAM and to read interleaved symbols therefrom is diagrammatically illustrated in FIG. 4. As shown, RAM 30 comprises a plurality of storage locations 60. Each storage location is accessible for storing data into the location or for reading data therefrom by a unique digital address (e.g., 0000 0000 0000 for the first storage location of cell 1). The storage locations 60 are divided into a plurality of cells. In FIG. 4, the division between cells is indicated by pointers 61, 62, 64, 66 and 68. Pointer 70 indicates the end of the last cell (cell (B−1)) used in the interleaver structure.

In accordance with the present invention, the cells are of increasing size. Thus, each successive cell has more storage locations than the immediately preceding cell. In the example illustrated in FIG. 4, a (B, N) convolutional interleaver is provided wherein B=32 and N=128. Each storage cell after cell 0 contains four more storage locations than the preceding storage cell (M=4). Thus, as shown in the figure, cell 0 contains one storage location, cell 1 contains four storage locations, cell 2 contains eight storage locations, and cell 3 contains twelve storage locations, etc. The thirty-first cell (cell (B−1)) contains 124 storage locations, commencing with address 111100000110 (decimal 3846) and ends at address 111101111111 (decimal 3968). The number M of cells by which each successive cell is greater than the preceding cell is equal to N/B. Thus, in the example given, M=(128/32)=4.

In order to provide the proper interleaving function, where each input symbol is separated from its adjacent input symbols by N intervening symbols, the storage locations within each cell are addressed in a first revolving manner and the set of (B−1) cells is addressed in a second revolving manner. Specifically, the locations within each cell are accessed in successive order, with the last location in the cell being followed by the first location in that cell. This is illustrated in FIG. 4 by arrows 72, 74, 76 and 78. With respect to cell 1, the cell locations 60 are addressed commencing with address 000000000000 down through address 000000000011. After the fourth location in cell 1 (i.e., address 0000 0000 0011) has been written into, the next location to be addressed will be the first location in cell 1, at address 000000000000.

Within each cell, data is first written into a cell location and then read from the next successive cell location. This is accomplished by the incrementing of the accumulators by CLK B as discussed above in connection with FIGS. 2 and 3. After a cell has had an input symbol written thereto and a stored symbol read therefrom, the next successive cell is addressed to write the next symbol to the location specified by its corresponding accumulator, and to read a stored symbol from the next successive storage location in that cell. Thus, the write/read operations proceed from cell 0 (the transfer stage) to cell 1 to cell 2 to cell 3 . . . and finally to cell (B−1). After an input symbol has been stored in cell (B−1) and a symbol has been read therefrom, the operation loops back to cell 0, as indicated by arrow 80. Cell 0 is a simple transfer cell, which merely transfers data from its input to its output with no delay, and forms the first interleaver stage. Cell 0 is addressed with a unique address, designated xxxx xxxx xxxx in FIG. 4. After an input symbol has been transferred by cell 0 (i.e., written to and read from the cell), the operation continues with cell 1 as described above.

Figure 5:
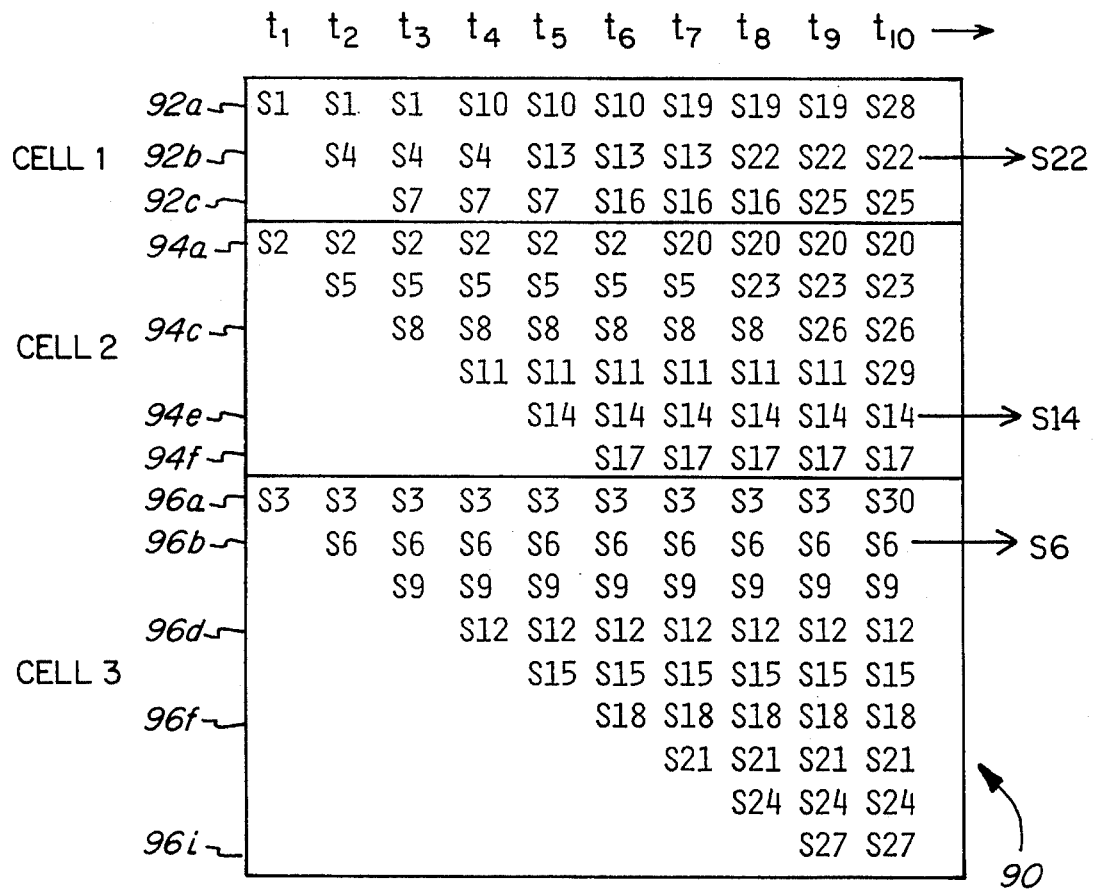
FIG. 5 is a diagrammatic illustration showing, for purposes of explanation, how a succession of RAM cells is loaded and read from in accordance with the present invention.

FIG. 5 illustrates how the operation just described in connection with FIG. 4 results in the interleaving (or deinterleaving) of symbols input to the RAM. FIG. 5 depicts a simple example in which only three cells are provided within the RAM. Each cell contains three more storage locations than the previous cell. Thus, cell 1 contains three storage locations 92a–c, cell 2 contains six storage locations 94a–f, and cell 3 contains nine storage locations 96a–i. When the interleaver is first turned on, enough symbols have to be loaded into the various cells before a proper interleaved output will commence. Thus, FIG. 5 contains different columns illustrating how the cell locations are filled over time. A first symbol S1 from a input data stream is loaded into the first location 92a of cell 1 at time $t_1$. At this point, nothing will yet have been loaded into cell 92b of cell 1, and although this cell will be read, nothing meaningful will be read therefrom. After symbol S1 is written into location 92a and location 92b is read, the next input symbol S2 is written into location 94a of cell 2. Then, cell 94b of cell 2 will be read, although at this point nothing meaningful will have been written into this location. The next input symbol S3 is then written into location 96a of cell 3. As with cells 1 and 2, nothing will have yet been written into location 96b, and although it is read, nothing meaningful will be output.

After location 96a of cell 3 has been written into, a second cycle of operation commences at time $t_2$. During this cycle, symbol S4 is written into location 92b of cell 1. Symbol S5 is written into location 94b of cell 2. Next, symbol S6 is written into location 96b of cell 3. During the next cycle, at time $t_3$, symbols S7, S8 and S9 are written into locations 92c, 94c and 96c of cell 1, cell 2 and cell 3, respectively. This process continues and eventually, by time $t_9$, all of the locations in cells 1, 2 and 3 have been loaded at least once. The interleaving operation can then commence in earnest, as illustrated during time $t_{10}$. After symbol S28 is written into location 92a of cell 1, overwriting symbol S19, previously stored symbol S22 is read from location 92b of cell 1. Then, symbol S29 will be written into location 94d of cell 2, overwriting symbol S11 which was previously stored in location 94d. Immediately thereafter, symbol S14 will be read from location 94e of cell 2. Then, symbol S30 will be written into location 96a of cell 3 and symbol S6 will be read from the next location in cell 3, i.e., location 96b. At this point, symbols S22, S14 and S6 will have been successively read out of RAM 90. It can be seen that although the symbols were input to the interleaver in order, they are output such that each output symbol is separated from its adjacent input symbol by eight intervening symbols. The original symbol order is recovered at a receiver using a deinterleaver that operates in the same manner as the interleaver.

It should now be appreciated that the present invention provides a convolutional interleaving/deinterleaving structure that uses a unique address generator circuit formed from a plurality of accumulators with supporting logic. By providing a plurality of memory cells of increasing size, and addressing the cell locations in a first revolving manner and the cells themselves in a second revolving manner, only about one-half of the memory used by prior art devices is required.

Although the invention has been described in connection with a preferred embodiment, it will be appreciated that numerous adaptations and modifications may be made thereto without departing from the spirit and scope of the invention as set forth in the claims.

I claim:

1. A convolutional interleaver for interleaving a stream of symbols to separate up to a number B of consecutive symbols containing errors such that said error containing symbols are separated from each other by at least a number N of intervening symbols, comprising:

> memory means providing (B−1) cells of increasing size for storing symbols from said stream, a first one of said (B−1) cells having M storage locations for storing M symbols and each successive one of said (B−1) cells having M more storage locations than an immediately preceding cell for storing M more symbols than said immediately preceding cell, where M is a number defined by the ratio of the number N over the number B (M=N/B);
>
> means for successively addressing said (B−1) cells to write a next symbol from said stream into a next write symbol location in a currently addressed cell and to read a symbol from the location of the currently addressed cell immediately following said next write symbol location, wherein:
>
> said locations are accessed in a first revolving manner such that the last location in a cell is followed by the first location in that cell,
>
> said (B−1) cells are addressed in a second revolving manner such that the last of said (B−1) cells, which is the (B−1)th cell, is followed by the first cell or vice versa, and
>
> each consecutive symbol from said stream is written into a next consecutive one of said (B−1) cells.

2. The interleaver in accordance with claim 1 wherein said means for addressing comprise:

> (B−1) accumulators, each associated with a different one of said (B−1) cells;
>
> means for initializing each of said (B−1) accumulators with a starting location in the cell associated therewith;
>
> means for incrementing the (B−1) accumulators to address a next location in the cell associated therewith after a symbol is written into that cell, said incrementing means accessing the storage locations in the cell in said first revolving manner; and
>
> means for sequentially coupling said (B−1) accumulators to an address port of said memory means to address said cells in said second revolving manner.

3. The interleaver in accordance with claim 2 wherein said memory means comprise a random access memory having a write control and a read control in addition to said address port, said interleaver further comprising:

> control means for actuating said write control when an accumulator is first coupled to said address port to enable the next symbol in said data stream to be written into the cell and cell location pointed to by the accumulator, and for actuating said read control when the accumulator has been incremented to the next cell location to enable a symbol to be read from said next cell location.

4. The interleaver in accordance with claim 1 wherein said memory means comprise a random access memory having an address port, a write control and a read control, said interleaver further comprising:

> control means for actuating said write control to enable the next symbol in said data stream to be written into a cell and cell location specified by an address that is input to said address port from said addressing means, and for actuating said read control after said address has been incremented to the immediately following cell location to enable a symbol to be read from said immediately following cell location.

5. The interleaver in accordance with claim 1 wherein a transfer stage is provided between said (B−1)th cell and said first cell, and said cells are addressed in said second revolving manner such that the (B−1)th cell is immediately followed by said transfer stage which, in turn, is immediately followed by said first cell, or vice versa.

6. The interleaver in accordance with claim 5 wherein said transfer stage comprises a storage location of said memory means.

7. An address generator for a (B,N) convolutional interleaver/deinterleaver, where B is a maximum number of consecutive symbols containing burst errors that are separable by the interleaver and N is a minimum separation inserted between errors by the interleaver, said address generator comprising:

> (B−1) accumulators, each associated with a different one of (B−1) cells;
>
> said cells comprising one of interleaver cells and deinterleaver cells of progressively increasing length;
>
> means for initializing each of said (B−1) accumulators with a starting address specifying a first storage location in an associated one of said (B−1) cells;
>
> means for incrementing each of said (B−1) accumulators to a next cell location address after a symbol is written into the cell associated with the accumulator, said next cell location addresses being provided in a first revolving manner such that the first location in a cell is addressed after the last location in that cell; and
>
> means for coupling said (B−1) accumulators to address said associated ones of said (B−1) cells in a second revolving manner such that the last of said (B−1) cells, which is the (B−1)th cell, is followed by the first cell or vice versa;
>
> wherein each consecutive symbol from said stream is written into a next consecutive one of said (B−1) cells.

8. The address generator in accordance with claim 7 further comprising:

> control means for actuating a write control input of said cells when an accumulator is first coupled to address a cell to enable the next symbol in said data stream to be written into the cell and cell location pointed to by the accumulator, and for actuating a read control input of said cells when the accumulator has been incremented to the next cell location to enable a symbol to be read from said next cell location.

9. The address generator in accordance with claim 7 wherein a transfer stage is provided between said (B−1)th cell and said first cell, and said cells are addressed in said second revolving manner such that the (B−1)th cell is immediately followed by said transfer stage which, in turn, is immediately followed by said first cell, or vice versa.

10. The address generator in accordance with claim 9 wherein said transfer stage comprises a storage location of said memory means.

11. A convolutional deinterleaver for reconstructing sets of a number B of consecutive symbols that are separated from each other in an interleaved data stream by at least a number N of intervening symbols, comprising:

> memory means providing (B−1) cells of increasing size for storing symbols from said stream, a first one of said (B−1) cells having M storage locations for storing M symbols and each successive one of said (B−1) cells having M more storage locations than an immediately preceding cell for storing M more symbols than said immediately preceding cell, where M is a number defined by the ratio of the number N over the number B (M=N/B);

means for successively addressing said (B−1) cells to write a next symbol from said interleaved data stream into a next write symbol location in a currently addressed cell and to read a symbol from the location of the currently addressed cell immediately following said next write symbol location, wherein:

said M storage locations are accessed in a first revolving manner such that the last location in a cell is followed by the first location in that cell, said (B−1) cells are addressed in a second revolving manner such that the last of said (B−1) cells, which is the (B−1)th cell, is followed by the first cell or vice versa, and each consecutive symbol from said interleaved data stream is written into a next consecutive one of said (B−1) cells.

12. The deinterleaver in accordance with claim 11 wherein said addressing means comprise:

(B−1) accumulators, each associated with a different one of said (B-I) cells;

means for initializing each of said (B−1) accumulators with a starting location in the cell associated therewith;

means for incrementing the (B−1) accumulators to address a next location in the cell associated therewith after a symbol is written into that cell, said incrementing means adapted to access the storage locations in the cell in said first revolving manner; and means for sequentially coupling said (B−1) accumulators to an address port of said memory means to address said (B−1) cells in said second revolving manner.

13. The deinterleaver in accordance with claim 12 wherein said memory means comprise a random access memory having a write control and a read control in addition to said address port, said deinterleaver further comprising:

control means for actuating said write control when an accumulator is first coupled to said address port to enable the next symbol in said interleaved data stream to be written into the cell and cell location pointed to by the accumulator, and for actuating said read control when the accumulator has been incremented to the next cell location to enable a symbol to be read from said next cell location.

14. The deinterleaver in accordance with claim 11 wherein said memory means comprise a random access memory having an address port, a write control and a read control, said deinterleaver further comprising:

control means for actuating said write control to enable the next symbol in said interleaved data stream to be written into a cell and cell location specified by an address that is input to said address port from said addressing means, and for actuating said read control after said address has been incremented to the immediately following cell location to enable a symbol to be read from said immediately following cell location.

15. The deinterleaver in accordance with claim 11 wherein a transfer stage is provided between said (B−1)th cell and said first cell, and said (B−1) cells are addressed in said second revolving manner such that the (B−1)th cell is immediately followed by said transfer stage which, in turn, is immediately followed by said first cell, or vice versa.

16. The deinterleaver in accordance with claim 15 wherein said transfer stage comprises a storage location of said memory means.

* * * * *